(12) United States Patent
Lee

(10) Patent No.: US 11,965,926 B2
(45) Date of Patent: Apr. 23, 2024

(54) ELECTRONIC COMPONENT TEST HANDLER HAVING FLYING SCAN FUNCTION

(71) Applicant: ATECO INC., Gunpo (KR)

(72) Inventor: Taek Seon Lee, Hwaseong (KR)

(73) Assignee: ATECO INC., Gunpo (KR)

( * ) Notice: Subject to any disclaimer, the term of this patent is extended or adjusted under 35 U.S.C. 154(b) by 225 days.

(21) Appl. No.: 17/438,889

(22) PCT Filed: Apr. 8, 2020

(86) PCT No.: PCT/KR2020/004719
§ 371 (c)(1),
(2) Date: Sep. 13, 2021

(87) PCT Pub. No.: WO2020/213873
PCT Pub. Date: Oct. 22, 2020

(65) Prior Publication Data
US 2022/0146569 A1    May 12, 2022

(30) Foreign Application Priority Data

Apr. 15, 2019    (KR) .................. 10-2019-0043941

(51) Int. Cl.
| | |
|---|---|
| *G01R 31/28* | (2006.01) |
| *G01R 1/02* | (2006.01) |
| *G01R 1/04* | (2006.01) |
| *G01R 1/067* | (2006.01) |
| *G01R 1/073* | (2006.01) |
| *H01L 21/67* | (2006.01) |
| *G06K 7/14* | (2006.01) |

(52) U.S. Cl.
CPC .... *G01R 31/2867* (2013.01); *H01L 21/67259* (2013.01); *H01L 21/67294* (2013.01); *G06K 7/1404* (2013.01)

(58) Field of Classification Search
CPC .... G01R 31/02; G01R 31/28; G01R 31/2834; G01R 31/2867; G01R 31/2887; G01R 31/2891; G01R 31/2893; G01R 1/02; G01R 1/04; G01R 1/067; G01R 1/073
See application file for complete search history.

(56) References Cited

U.S. PATENT DOCUMENTS 5,865,319 A * 2/1999 Okuda ............... G01R 31/2851
209/571

FOREIGN PATENT DOCUMENTS

| KR | 20150010038 A | 1/2015 |
|---|---|---|
| KR | 101734397 B1 | 5/2017 |
| KR | 20170068174 A | 6/2017 |
| KR | 20170087750 A | 7/2017 |
| KR | 20170108703 A | 9/2017 |

(Continued)

*Primary Examiner* — Neel D Shah

(57) ABSTRACT

The present invention relates to an electronic component test handler comprising: a hand configured to pick up and transfer a plurality of devices; and a scanner configured to scan a region of a movement path of a device picked up by the hand at a predetermined angle. The electronic component test handler having a flying scan function according to the present invention is capable of scanning during a transfer process without a change in position after picking up a device, and thus, operations and time required for the scanning may be reduced, thereby improving efficiency.

12 Claims, 18 Drawing Sheets

(56) References Cited

FOREIGN PATENT DOCUMENTS

KR   20180110546      * 10/2018   ............... G06K 9/20
KR   20180110546 A   10/2018

* cited by examiner

ELECTRONIC COMPONENT TEST HANDLER HAVING FLYING SCAN FUNCTION

TECHNICAL FIELD

The disclosure relates to a test handler having a scanner capable of scanning a device in an electronic device test handler.

BACKGROUND ART

An electronic device test handler refers to an apparatus for testing a plurality of electronic devices, for example, semiconductor devices or modules, and solid-state drives (SSD) after they are manufactured. The electronic device test handler is provided to connect the electronic devices to a test apparatus, test whether the electronic devices normally operate under various artificial environments, and sort out the electronic devices by distinguishing among passed components, components to be retested, defective components, etc. according to test results.

The electronic device test handler carries out material transport by exchanging a user tray, which is loaded with devices to be tested or with tested devices, with the outside, and the material transport to the outside should be performed in an appropriate cycle so as to continue testing.

Regarding such a test handler, there has been disclosed Korean Patent No. 1,734,397 (registered on May 2, 2017) applied by the present applicant.

However, such a conventional test handler has a problem that devices have to be inefficiently transferred to scanning positions when the devices are subjected to scanning, and then returned to their original positions after the scanning.

DISCLOSURE

Technical Problem

An aspect of the disclosure is to provide an electronic device test handler having a flying scan function, which can solve the foregoing problem with the conventional scanning.

Technical Solution

To achieve the aspect of the disclosure, there is provided an electronic device test handler including: a hand provided to pick up and transfer a plurality of devices; and a scanner provided to scan a region at a predetermined angle on a transfer path of the devices picked up by the hand.

Meanwhile, the hand may be provided to pick up the plurality of devices to be spaced apart from each other side by side, and the scanner may be provided to scan a space between the devices at a predetermined angle.

Meanwhile, the device may include a plate-type substrate, the substrate including at least one scanning code on one side thereof, and the hand may pick up the plurality of devices with the scanning codes arranged in one direction.

Further, the scanner may be provided to scan the scanning code whenever the device passes through a scan region on the transfer path of the devices.

Further, the hand may be controlled to pass through the scan region while moving.

Further, the hand may be controlled to stop at least once while moving in the scan region so that the plurality of devices can be sequentially positioned in the scan region.

Meanwhile, a distance between the plurality of substrates includes a distance at which the scanning code does not interfere with an adjacent substrate when the scanner performs the scanning at an inclined angle.

Meanwhile, the hand may be provided to move above the scanner, and the scanner may be provided to perform the scanning while facing upward at a predetermined angle from a horizontal direction.

Meanwhile, the scanner may be provided to perform the scanning while facing frontward and upward in back of the hand when the hand with the devices passes through the scan region.

Meanwhile, the scanner may be provided to perform the scanning while facing backward and upward in front of the hand when the hand with the devices passes through the scan region.

Further, the scanner may be provided to recognize the scanning code including at least one of a one-dimensional code and a two-dimensional code.

Meanwhile, the electronic device test handler may further include a controller configured to control operations of the hand and the scanner, wherein the controller controls the scanner to perform the scanning whenever each of the plurality of devices passes through the scan region.

Advantageous Effects

According to the disclosure, an electronic device test handler having a flying scan function can perform scanning during a transfer process without any separate position change after picking up devices, and thus operations and time taken in the scanning are reduced, thereby having an effect on improving efficiency.

MODE FOR CARRYING OUT DISCLOSURE

Figure 1:
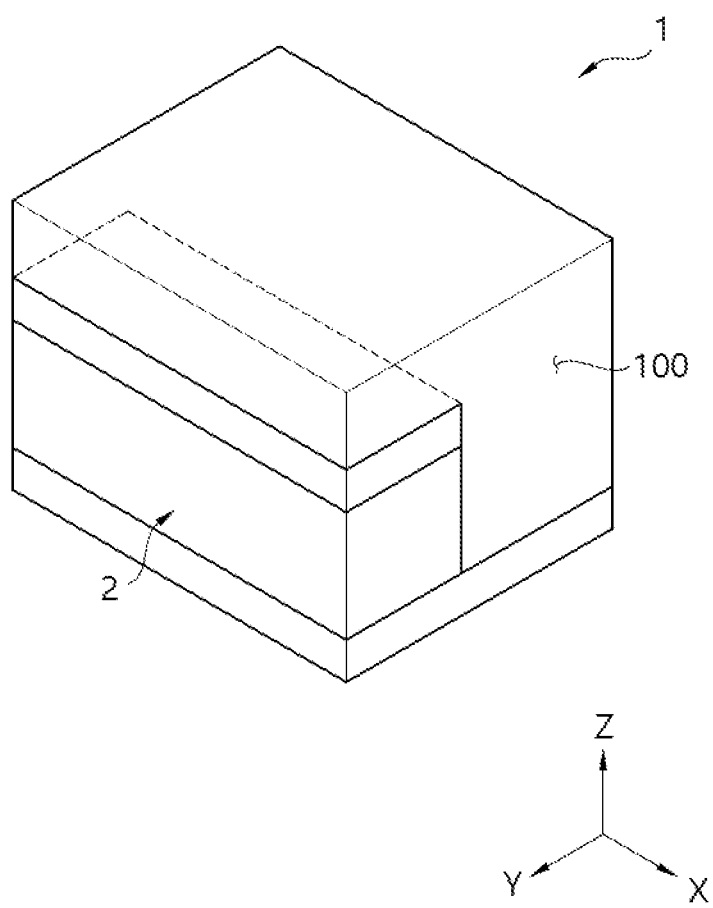
FIG. 1 is a conceptual view of an electronic device test handler, which is divided into spaces corresponding to functions, according to the disclosure.

Below a stacker of an electronic device test handler and an electronic device test handler including the same according to an embodiment of the disclosure will be described in detail with reference to the accompanying drawings. Elements described in the following embodiments may be called other names in relevant fields. However, if the elements are similar or identical in terms of their functions, they may be regarded as equivalents even in alternative embodiments. Further, signs assigned to the elements are given for convenience of description. However, content on the drawings with these given signs do not limit the elements to a range in the drawings. Likewise, even though the elements on the drawings are partially modified according to alternative embodiments, they having functional similarity and identity may be regarded as equivalents. Further, if those skilled in the art recognizes natural involvement of elements, descriptions of the elements will be omitted.

The following description will be made on the premise that a device refers to an electrically functional element such as a semiconductor device, a semiconductor module, a solid-state drive, etc. Further, the following description will be made on the premise that a user tray refers to a tray including a plurality of loading grooves regularly arranged to be loaded with semiconductor devices, and the loading groove does not have any separate holding function so that the device can be held in the groove by its own weight.

Below, an overall structure of the test handler according to the disclosure be described with reference to FIGS. 1 to 3.

FIG. 1 is a perspective view of a test handler according to the disclosure.

As shown in FIG. 1, a test handler 1 according to the disclosure is structured to bring a device 20 from the outside, perform a test, and selectively take the device 20 out according to grades.

According to functions, the test handler 1 may be spatially divided into a region, i.e., a stacker for bringing a plurality of user trays 10 from the outside or taking the user trays 10 to the outside, and a region, i.e., a test handler main body 100 for transferring the device 20 from the user tray 10, performing the test, sorting out the device 20 according to the grades, and loading the device 20 into the user tray 10.

The stacker 2 refers to a region to be loaded with the user tray 10 in quantity. The stacker may include a loading stacker, an unloading stacker and an empty stacker according to the loaded device 20.

The loading stacker is provided to load therein the user tray 10 loaded with the devices 20 needed to be tested and sorted out. The loading stacker is provided to have a size for loading therein the plurality of user trays 10 brought from the outside and loaded in units of '1 lot'. The unloading stacker is provided to load therein a plurality of user trays 10, which are loaded with the devices 20 to be taken out among the tested and sorted devices 20, in units of '1 lot' before taking the devices 20 out. The empty stacker is structured to load there in a plurality of empty user trays 10, and provided to receive the empty user trays 10 after the transfer of the devices 20 from the loading stacker is completed, or transfer the empty user tray 10 to the unloading stacker.

Meanwhile, the loading stacker, the unloading stacker, and the empty stacker may be classified according to material transport to the outside, material transport inside the test handler 1, and loading purposes, but their own structures may be the same or similar.

Each stacker module 400 may be provided to vertically stack and load the plurality of user trays 10 for efficient use of a space. Further, each stacker module 400 is provided to horizontally move in the direction of 'Y' in FIG. 1 and opened and closed, and allows the material transport to the outside to be carried out at a position of being taken out. For example, the plurality of user trays 10 may be transferred from an automatic guided vehicle (AGV) to the loading stacker, or the AGV may collect the plurality of user trays 10 from the unloading stacker.

Further, the stacker 2 may be provided to include the loading stacker, the unloading stacker, and the empty stacker, each of which is set in plural, so that internal material transport can be continuously performed even while one of the loading stacker, the unloading stacker and the empty stacker is performing the material transport to the outside.

Below, the structures and operations of the test handler main body 100 will be schematically described with reference to FIGS. 2 and 3.

Figure 2:
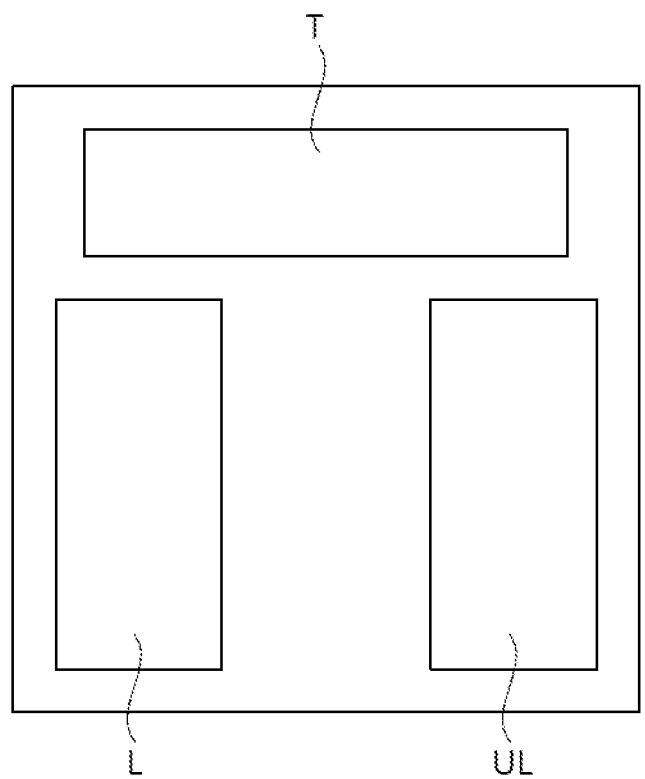
FIG. 2 is a conceptual view of a test handler main body of FIG. 1, which is divided on a plane according to functions.
Figure 3:
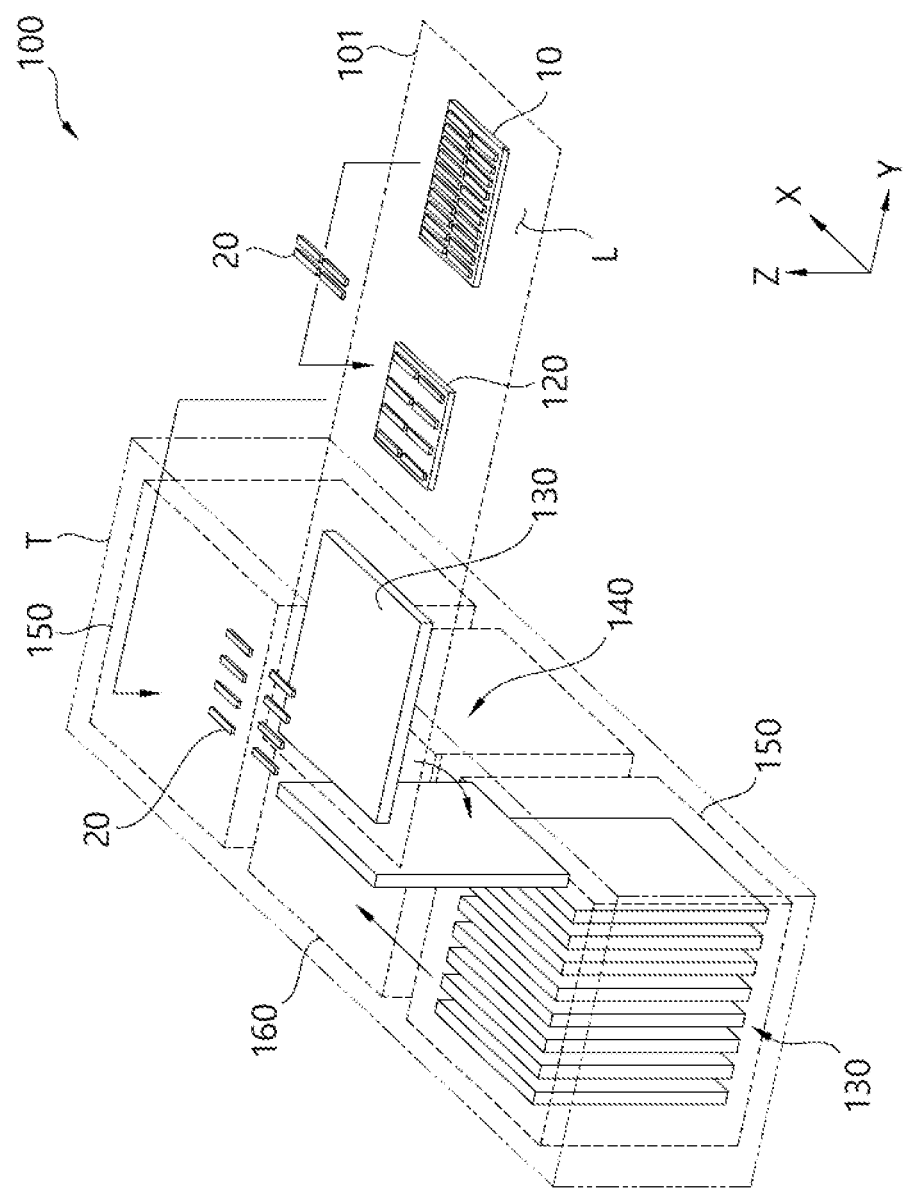
FIG. 3 is a conceptual view of movement of a device and a test tray in the test handler main body.

FIG. 2 is a conceptual view of the test handler main body 100 of FIG. 1, which is divided on a plane according to functions, and FIG. 3 is a conceptual view of movement of the device 20 and the test tray 130 in the test handler main body 100.

In the test handler main body 100, the plurality of devices 20 are subjected to a test, and the devices 20 are sorted after the test, the device 20 may be transferred and loaded before and after the test. The test handler main body 100 may be functionally divided into a loading site L, a test site T, and an unloading site UL.

The loading site L is provided to pick up the plurality of devices 20 from the user tray 10 and place the devices 20 in a test tray 130. The loading site L may include a hand 110 and a loading shuttle 120 to transfer the device 20 from the user tray 10 to the test tray 130, and a scanner (not shown) to perform the test.

At a pick-up position, the user trays 10 loaded into the loading stacker may be alternately supplied one by one, and the hand 110 (to be described later) picks out and transfers only the plurality of devices 20 from the user tray 10. After all the loaded devices 20 are transferred, the empty user tray 10 is replaced by the user tray 10 loaded with the devices 20 to thereby continuously supply the device 20. Meanwhile, at the pick-up position, the plurality of user trays 10 may be exposed to continuously supply the devices 20 even when the user trays 10 loaded into one stacker module 400 are used up or go wrong. In this case, while the devices 20 are being transferred fro one user tray 10, another user tray 10 may be on standby or replaced by a new user tray 10.

The hand 110 is provided to pick up and transfer the plurality of devices 20 and then load the plurality of devices 20 into the test tray 130 or the loading shuttle 120. The hand 110 may be provided in plural and be in charge of the material transport in every transfer section. The hand 110 may be installed on an upper rail so as to move in a horizontal direction, and may include an attachment which faces downward and a linear actuator (not shown) by which length adjustment is possible in a vertical direction. The attachment may for example include a plurality of vacuum ports to vacuum-adsorb the plurality of devices 20. Further, the attachment may be replaceable according to the kinds, sizes and shapes of the device 20.

Meanwhile, the test tray 130 includes an insert in every loading groove in consideration of thermal deformation or the like of the device 20 while the device 20 is held and subjected to the test, and a space between the loading grooves of the test tray 130 may be different from that of the user tray 10. In general, the space between the loading grooves of the test tray 130 is greater than that of the user tray 10. Therefore, the plurality of devices 20 are picked up from the user tray 10 at the pick-up position by the hand 110, and then loaded into the test tray 130 while widening the space between the devices 20. Specifically, to widen the space in two directions of X and Y, space adjustment may be performed twice. To this end, the loading shuttle 120 is provided between the pick-up position and the test tray 130, the space is adjusted in one direction during transfer from the user tray 10 to the loading shuttle 120, and the space is adjusted in the other direction during transfer from the loading shuttle 120 to the test tray 130.

The loading shuttle 120 is provided between the user tray 10 and the test tray 130, and the loading grooves are arranged with a more widened space therebetween in one direction than that of the user tray 10 so that the plurality of devices 20 can be loaded as primarily arranged. Further, the loading shuttle 120 may be position-controlled in consideration of the positions of the user tray 10, the test tray 130 and the hand 110 for the efficiency of the material transport.

The scanner (not shown) is provided to identify a barcode when the device 20 to be transferred has the barcode. The scanner (not shown) may be provided to scan the barcode on a path where the hand 110 picks up and transfers the device 20. The scanner may be provided at various positions so as to easily scan the barcode according to the shapes, sizes and kinds of the device 20.

At a placing position, the empty test tray 130 is supplied and the device 20 is transferred and loaded. When the devices 20 are completely loaded at the placing position, the test tray 130 is then transferred to the test site T, so as to receive a new empty test tray 130.

Meanwhile, although it is not shown, a mask and a preciser may be provided at the placing position to prevent the devices 20 from separation after the devices are settled on the test tray 130. As described above, the test tray 130 includes the inserts in the respective loading grooves, and each insert includes a locking portion to prevent the device 20 from separation. A default position of each locking portion is set as a position for preventing the device 20 from separation.

The loading of the device 20 into the test tray 130 is achieved by expanding the locking portion of the insert to the mask in the state that the insert is pressed by the preciser, and transferring the device 20 to the loading groove by the hand 110.

The mask is shaped corresponding to the test tray 130, and includes a plurality of projections 421 to respectively expand the locking portions of the inserts when being in close contact with the test tray 130.

The preciser is as described above provided to temporarily hold the inserts provided in the test tray 130 and having a little gap. The preciser includes a plurality of pressure pins respectively corresponding to the positions of the inserts, and temporarily holds the test tray 130 as the preciser is in close contact with the test tray 130 and presses the inserts. Therefore, it is possible to minimize a position error when the device 20 is settled on the insert.

However, although it is not shown, an elevator for moving the mask and the preciser up and down independently of each other may be additionally provided.

The test site T is provided to make the plurality of devices 20 loaded into the test tray 130 be tested in units of the test tray 130, and transmit a test result. In a test chamber 160, a thermal load test may for example be performed to test the functions of the devices 20 within a temperature of −40° C. to 130° C.

The test site T may include the test chamber 160 and buffer chambers 150 provided before and after the test chamber 160. The buffer chamber 150 is provided to be loaded with the plurality of test trays 130, and provided so that pre-heating or post-heating treatment can be performed before and after performing the thermal load test.

In the test site T, the test tray 130 can be transferred and tested as being kept upright, thereby reducing the overall size of the test handler. Although it is not illustrated in detail, a position switching unit 140 may be provided before and after the buffer chamber 150 and switch the position of the test tray 130 over to an upright position.

The unloading site UL is provided to sort out, transfer and load the devices 20 of the test tray 130 transferred from the test site T according to the test results. The unloading site UL may include elements similar to those of the loading site L, and transfer the device 20 in reverse order from that of the loading site L. However, the unloading site UL may include a plurality of sorting shuttles 170 to temporarily collect the devices 20 according to the grades from the test tray 130. To improve the efficiency of the material transport, when a predetermined number of devices 20 having the same grade are loaded into the sorting shuttle 170, a plurality of devices 20 may be picked up and transferred to the user tray 10 at the same time.

Meanwhile, although it is not shown, the empty test tray 130, of which the transfer of the devices 20 is finished in the unloading site UL, may be circulated as transferred toward the loading site L.

Further, although it is not shown, a controller may be additionally provided to control the activation of the foregoing elements.

Below, the stacker according to the disclosure will be described in detail with reference to FIGS. 4 to 8.

Figure 4:
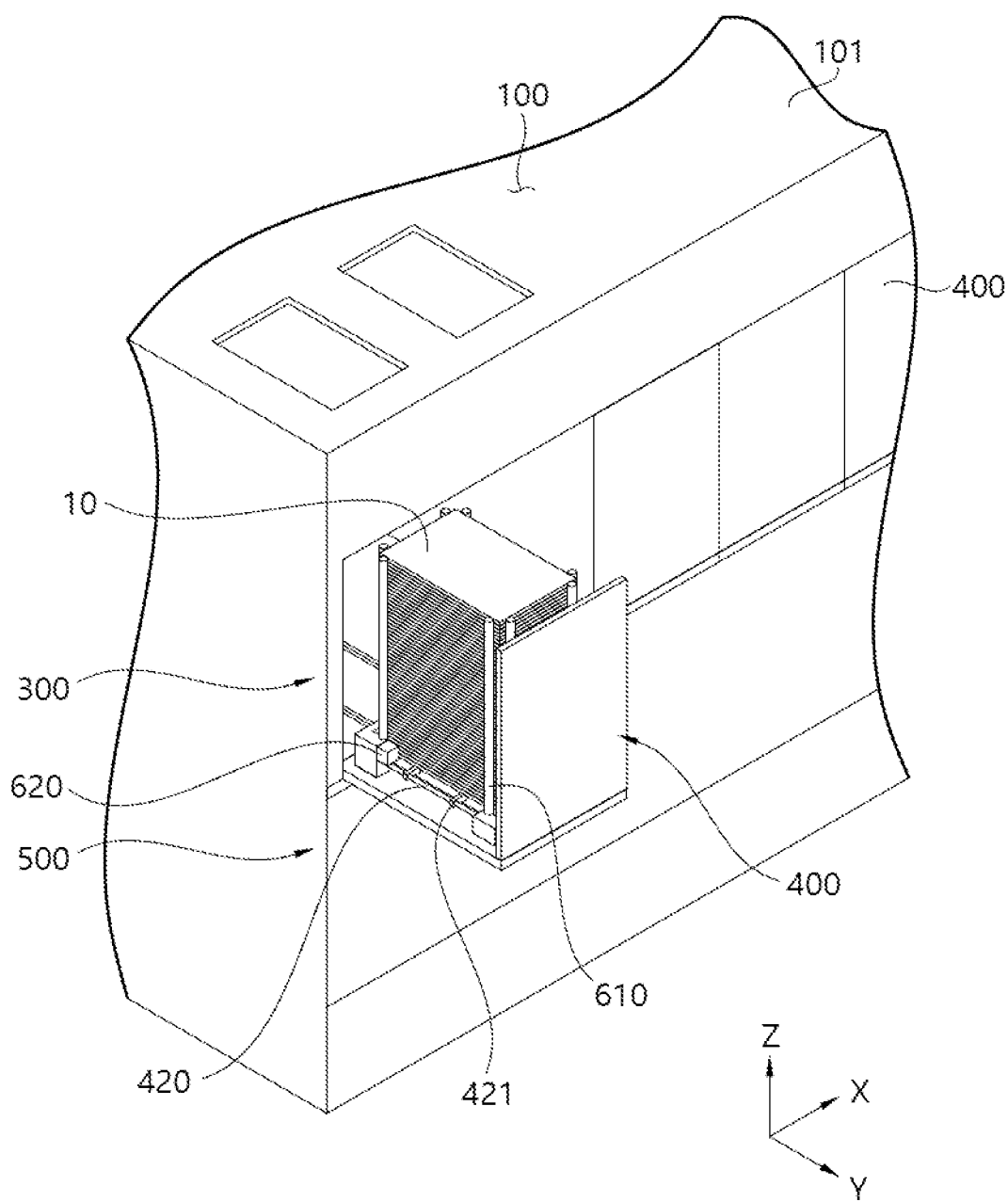
FIG. 4 is a partial perspective view of a stacker of the electronic device test handler according to the disclosure.
Figure 5:
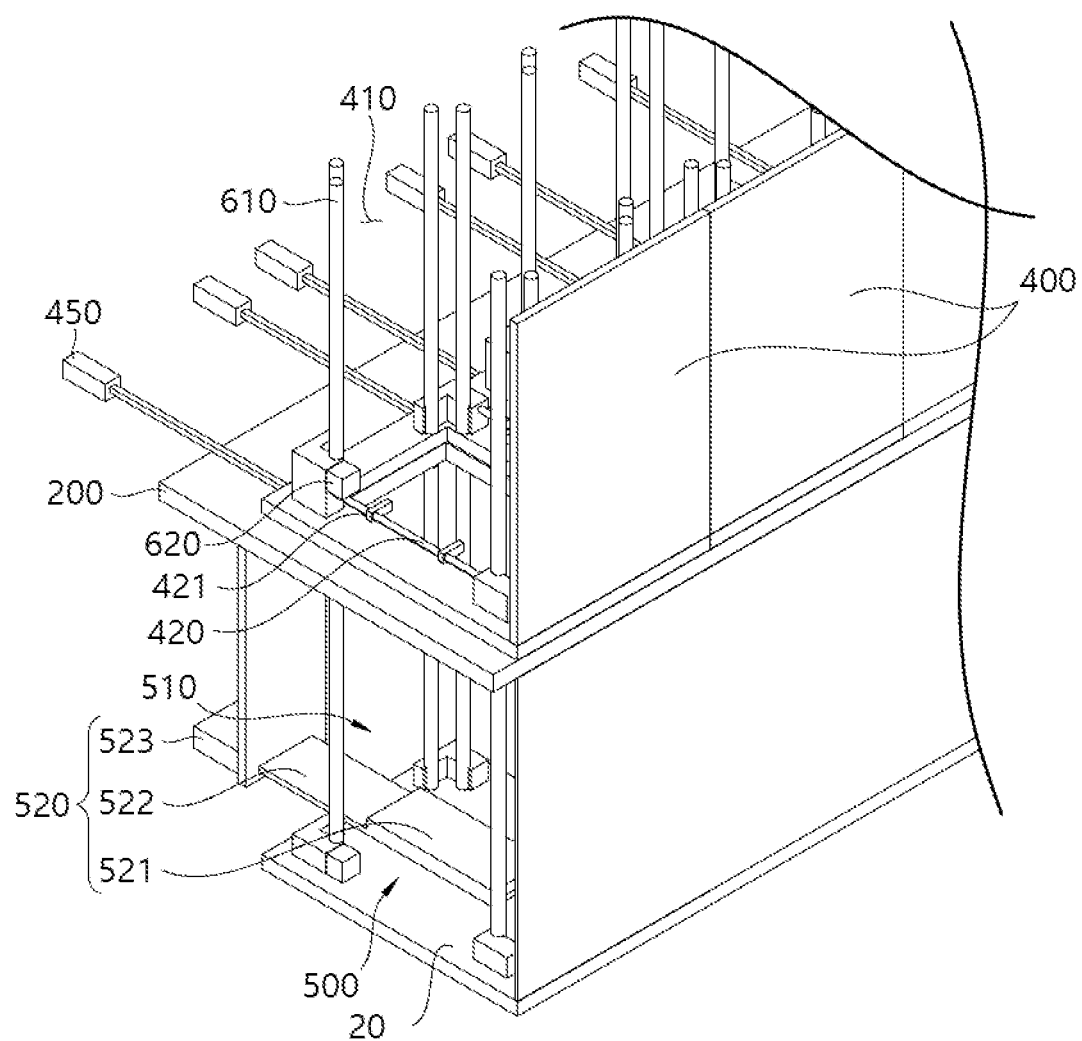
FIG. 5 is an enlarged perspective view, in which some elements of FIG. 4 are enlarged.

FIG. 4 is a partial perspective view of a stacker of the electronic device test handler 1 according to the disclosure, and FIG. 5 is an enlarged perspective view, in which some elements of FIG. 4 are enlarged.

As shown therein, the stacker according to the disclosure may be provided to continuously supply or collect the devices 20 under a base 101 of the test handler main body 100. The stacker may include a lower stacker 500 and a lower stacker 500.

The upper stacker 300 is provided to be loaded with the plurality of user trays 10 received from the outside, and provided to allow the user tray 10 to be transferred therein by a transfer 310. The upper stacker 300 is provided to supply the user tray 10 toward the base 101 of the main body 100 through an upper side, or exchange the user tray 10 with the lower stacker 500 through a lower side. The upper stacker 300 may include the transfer 310, a set plate 320 and the stacker module 400.

The transfer 310 is configured to grip and transfer the user tray 10 inside the upper stacker 300. The transfer 310 is provided in plural, which may include one or more transfers 310 involved in loading and one or more transfers 310 involved in unloading. The transfer 310 may include a plurality of actuators (not shown) for horizontal movement and vertical movement. The transfer 310 may be controlled to transfer the user tray 10 between one of first stacking portions 410 and one of set plates 320. Further, the transfer 310 may be controlled to perform the material transport of the user tray 10 between the first stacking portions 410. The transfer 310 may be controlled to withdraw the user trays 10 one by one from the upper side of the first stacking portion 410, or, reversely, stack and load the user trays 10 one by one into the lower side.

The set plate 320 is provided to expose the received user tray 10 to the test handler main body 100. The set plate 320 is provided to move up and down with the loaded user trays 10. When moving up, the set plate 320 is moved to a position where the hand 110 of the test handler main body 100 can pick up the device 20. When moving down, the set plate 320 is moved to a position where the transfer 410 unit can replace the user tray 10. The set plate 320 may be provided in plural between the loading site L and the unloading site UL.

The stacker module 400 is provided in plural, and the stacker modules 400 are opened and closed independently of each other to exchange the user tray 10 with the outside. The plurality of stacker modules 400 may be provided 1:1 corresponding to the number of second stacking portions 510 in the lower stacker 500 (to be described later). The stacker module 400 may be provided to be opened moving in the horizontal direction, i.e., in the direction of Y in FIG. 4. The stacker module 400 may include a frame 200, the first stacking portion 410, a holder 420, a slider 430, a linear actuator 450, a guide 610, a sensor 620 and a door 440.

The frame 200 may be structured to form an overall framework.

The first stacking portion 410 refers to a space where the plurality of user trays 10 are stacked and loaded. The first stacking portion 410 may be loaded with the user trays 10 as much as '1 lot' by which the user trays 10 are exchanged with an external means for transferring the user tray 10, for example, a robot. However, the number of user trays 10 corresponding to '1 lot' may be variously varied depending on the kinds of the device 20, and thus detailed descriptions about an exemplary example thereof will be omitted. The space of the first stacking portion 410 may be formed corresponding to the shape and size of the user tray 10.

The holder 420 may be provided to selectively pass or support the user tray 10 between the first stacking portion 410 and the second stacking portion 510 (to be described later). The holder 420 may be provided as a pair in each first stacking portion 410, and each holder 420 may include the projection 421. The projection 421 may be asymmetrically provided along a turning direction so that obstruction can be selectively generated on a transfer path of the user tray 10 when the holder 420 turns. The projection 421 may be provided to substantially support the bottom of the user tray 10. At the lower side of the first stacking portion 410, the frame 200 has a hole through which the user tray 10 can go in and out, so that when the user tray 10 can pass through the hole when the holder 420 is opened. The holder 420 may include the projection 421 protruding on the transfer path of the user tray 10 between the second stacking portion 510 and the first stacking portion 410 when the holder 420 is closed. When the holder 420 is opened, the projection 421 is turned not to obstruct the transfer path of the user tray 10.

The slider 430 may be provided at the lower side of the stacker module 400 so that the stacker module 400 can slide and move relative to the frame 200. The slider 430 may be provided in plural to stably support the stacker module 400 from below, and restrict the stacker module 400 to move to a given reciprocating position.

The linear actuator 450 is provided to move the stacker module 400 in the horizontal direction. The linear actuator 450 includes a first side connected to the frame 200 and a second side connected to a first side of the stacker module 400 and is provided to open and close the stacker module 400 in response to an input. This embodiment shows the linear actuator 450 by way of example, but various alternative elements may be applied for the reciprocation of the stacker module 400.

The guide 610 is provided to prevent the user tray 10 from being separated from the first stacking portion 410 in the state that the plurality of user trays 10 are stacked. The guide 610 is formed as vertically extended from a plurality of points along the circumference of the first stacking portion 410. For example, two adjacent guides 610 may be provided in the edges of the user tray 10, and a total of eight guides 610 may be provided. The length of the guide 610 is extended long enough to prevent the user tray 10 from being separated in a lateral direction while exchanging the user tray 10 with the second stacking portion 510. In other words, a distance between the top end portion of the guide 610 of the second stacking portion 510 and the upper first stacking portion 410 may be shorter than the thickness of the user tray 10.

The sensor 620 may be provided to identify the presence and the loading completion of the user tray 10 in the first stacking portion 410. The sensor 620 may be provided to identify the presence of the user trays 10 positioned at the uppermost and lowermost sides when the user trays 10 are loaded into the first stacking portion 410. When the uppermost sensor senses the presence of the user tray 10, it is identified that the user tray 10 is completely loaded into the first stacking portion 410, and a corresponding subsequent operation is controlled. On the other hand, when the lowermost sensor senses the absence of the user tray 10, it is identified that the first stacking portion 410 is empty, and a corresponding subsequent operation is controlled. Meanwhile, when the user trays 10 from the outside are loaded in units of '1 lot' and the lowermost sensor detects the user tray 10, it is identified that the first stacking portion 410 is full of the user tray 10. On the other hand, when the user tray 10 is not detected, it is identified that the first stacking portion 410 is used up and empty. Meanwhile, the foregoing sensor 620 may employ variously sensors, such as a laser sensor, an infrared sensor, an ultrasonic sensor, etc. as long as it can identify the presence of the user trays 10 at spaced points.

The door 440 is provided to shield the stacker module 400 from the outside when the stacker module 400 moves to and completely inserted in the stacker.

The lower stacker 500 is provided below the upper stacker 300. The lower stacker 500 may be an additional loading space for the user trays 10 usable in the upper stacker 500. The lower stacker 500 may include the second stacking portion 510, a second stacking portion elevator 520, the guide 610, and the sensor 620.

Like the first stacking portion 410, the second stacking portion 510 may also be defined as a space into which the user tray 10 is loadable. The second stacking portion 510 is provided to exchange the user tray 10 with the first stacking portion 410 through the upper side. The number of second stacking portions 510 is the same as the number of stacker modules 400, and thus the second stacking portions 510 are arranged side by side below the stacker module 400. The first stacking portions 410 and the second stacking portions 510 may be in 1:1 correspondence with each other.

The second stacking portion elevator 520 is provided to move the plurality of user trays 10 up and down in the vertical direction. The second stacking portion elevator 520 may include a supporting plate 521, a supporter 522, and an elevation actuator 523. The supporting plate 521 is provided to support the user tray 10 loaded into the second stacking portion 510 on the top surface thereof. The supporting plate 521 may be provided to have a size not to be obstructed by the projections 421 when moving between the second stacking portion 510 and the first stacking portion 410 even though the projections 421 of the holder 420 are closed. The supporter 522 is provided at a frame side, and connected to the supporting plate 521. The elevation actuator 523 is connected to the supporter 522 and moves the supporter 522 up and down. The elevation actuator 523 may be provided to adjust the level of the supporting plate 521 from the lower side of the second stacking portion 510 to the lower side of the first stacking portion 410.

Meanwhile, the guide 610 and the sensor 620 may be provided in the second stacking portion 510 like those of the foregoing first stacking portion 410. However, the guide 610 may be provided to have a length similar to the loading height of '1 lot'.

Below, operations of the stacker according to the disclosure will be described with reference to FIGS. 6A to 8.

FIGS. 6A, 6B, 6C, 60, 6E and 6F are operational views of the user tray 10 transferred between the first stacking portion 410 and the second stacking portion 510. As shown therein, when the user tray 10 is transferred from the second stacking portion 510 to the first stacking portion 410, the user trays 10 stacked in the second stacking portion 510 are supported and moved upward.

Figure 6A:
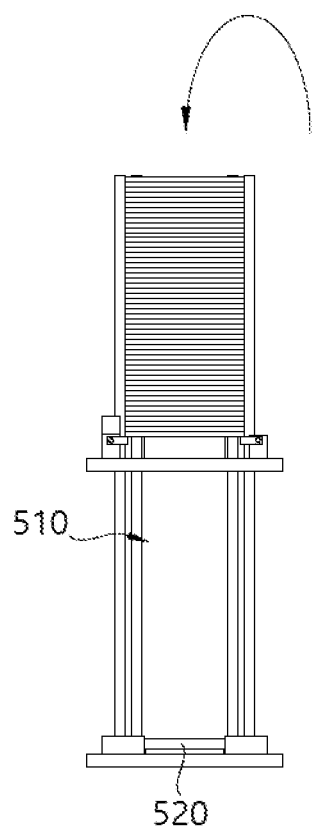
FIGS. 6A, 6B, 6C, 6D, BE and BF are operational views of a user tray transferred between a first stacking portion and a second stacking portion.
Figure 6B:
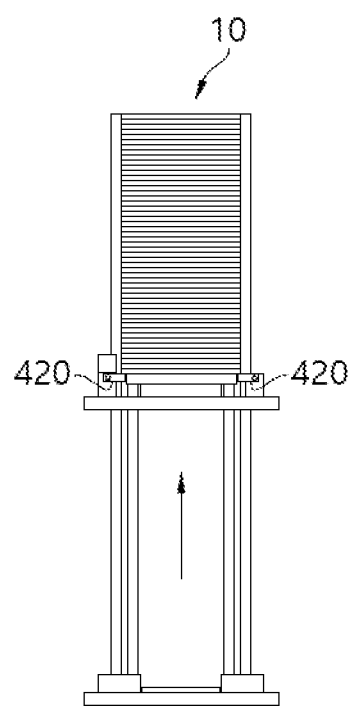
Figure 6C:
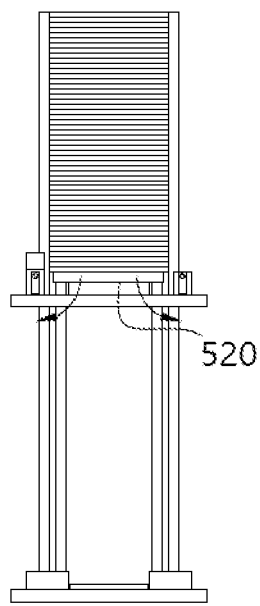
Figure 6D:
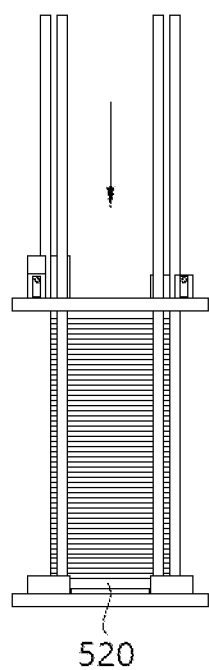
Figure 6E:
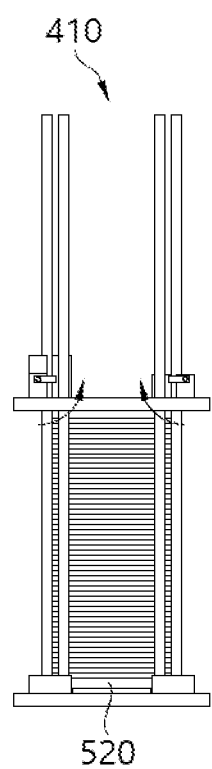
Figure 6F:
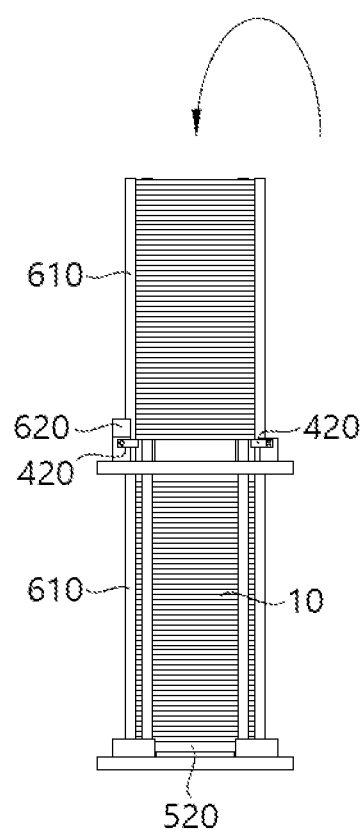

First, referring to FIG. 6A, the operations of the second stacking portion elevator 520 and the holder 420 are as follows. The stacker module 400 is opened. Then, the user trays 10 of '1 lot' from the outside are loaded into the first stacking portion 410, and the stacker module 400 is inserted at an original position. Then, referring to FIG. 6B, when there is a need of transferring the user tray 10 to the second stacking portion 510, the second stacking portion elevator 520 is moved up to support the bottom of the stacked user trays 10. In this case, the supporting plate 521 of the second stacking portion elevator 520 may be smaller than the user tray 10, and thus support the bottom of the user trays 10 while avoiding obstruction of the holder 420 even though the holder 420 is closed. Further, the elevated level of the second stacking portion elevator 520 may be determined so that the bottom level of the lowermost user tray 10 of the first stacking portion 410 can be higher than the supporting level of the holder 420. Then, referring to FIG. 6C, when the user tray 10 is supported by the second stacking portion elevator 520 in the first stacking portion 410, the holder 420 is opened. Next, referring to FIG. 6D, the user tray 10 is then supported by the second stacking portion elevator 520, and therefore the user tray 10 is also moved down toward the second stacking portion 520 when the second stacking portion elevator 520 is moved down. Then, referring to FIG. 6E, the holder 420 is closed again when the user tray 10 is completely moved to the second stacking portion 520. Next, as shown in FIG. 6F, the stacker module 400 is opened to load the user trays 10 again.

Meanwhile, although it is not shown, when the user tray 10, of which the test is finished, is taken out at the unloading side, the control is performed in reverse order from the foregoing order, thereby transferring the plurality of user trays 10 from the second stacking portion 510 to the first stacking portion 410.

Figure 7:
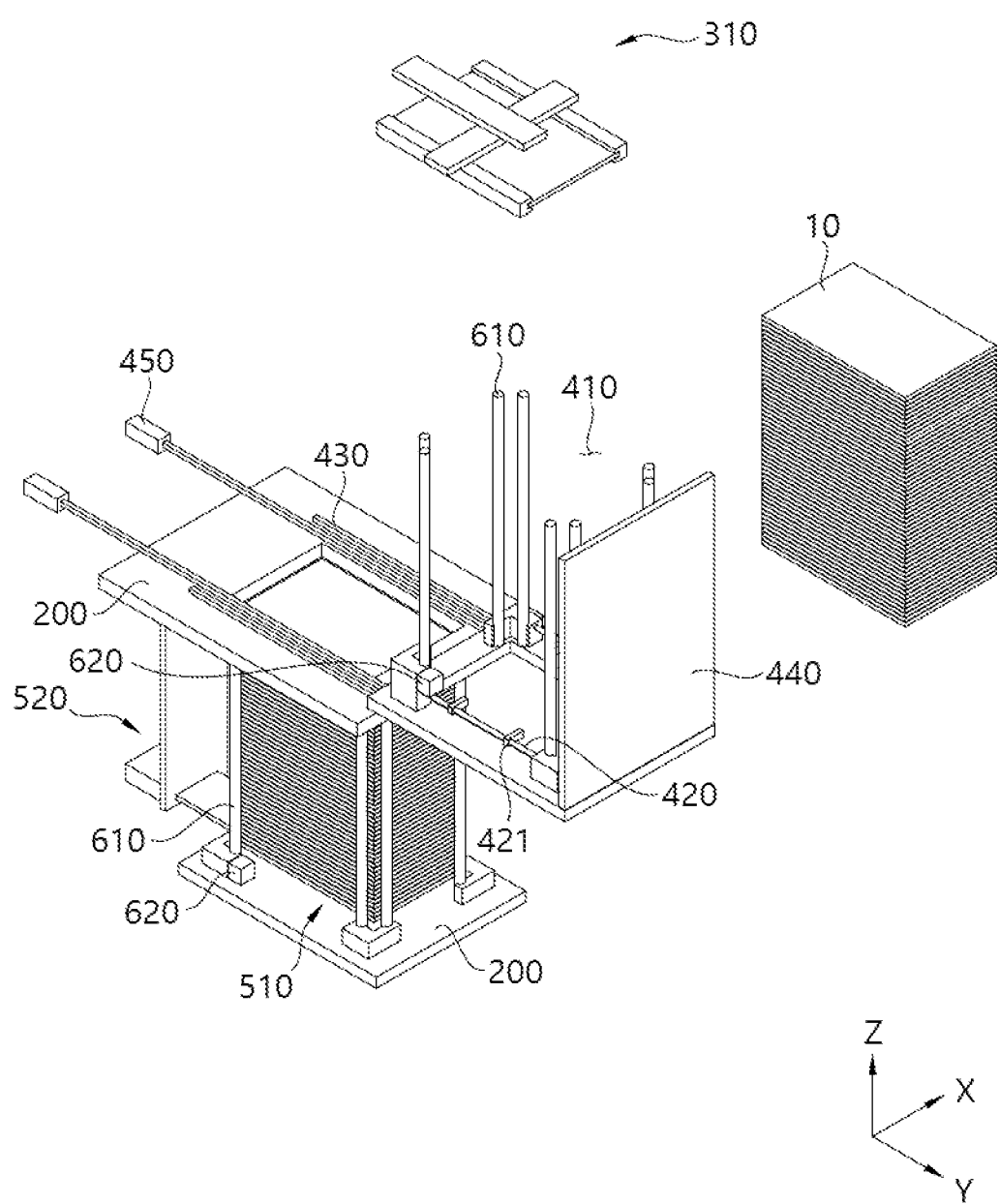
FIG. 7 is a conceptual view of operation of the stacker during material transport between the first stacking portion and an outside.

FIG. 7 is a conceptual view of operation of the stacker during material transport between the first stacking portion and an outside. When the first stacking portion 410 is empty as shown in FIG. 6E, it is possible to receive the user trays 10 from the outside. In this case, the stacker module 400 can transfer the user tray 10 to the second stacking portion 510. Therefore, when an external robot passes an adjacent position, the first stacking portion 410 may be emptied out and then additionally loaded with the user trays 10. Meanwhile, when a cycle of supplying the user trays 10 from the outside becomes longer, the first stacking portion 410 and the second stacking portion 510 for the supply are arranged in two or more rows. Therefore, when the user trays 10 are used up in one row, the user trays 10 loaded in another row are supplied. In this case, the user trays 10 may be loaded into the plurality of stacker modules 400 at the same time when the user trays 10 are supplied from the outside.

Figure 8:
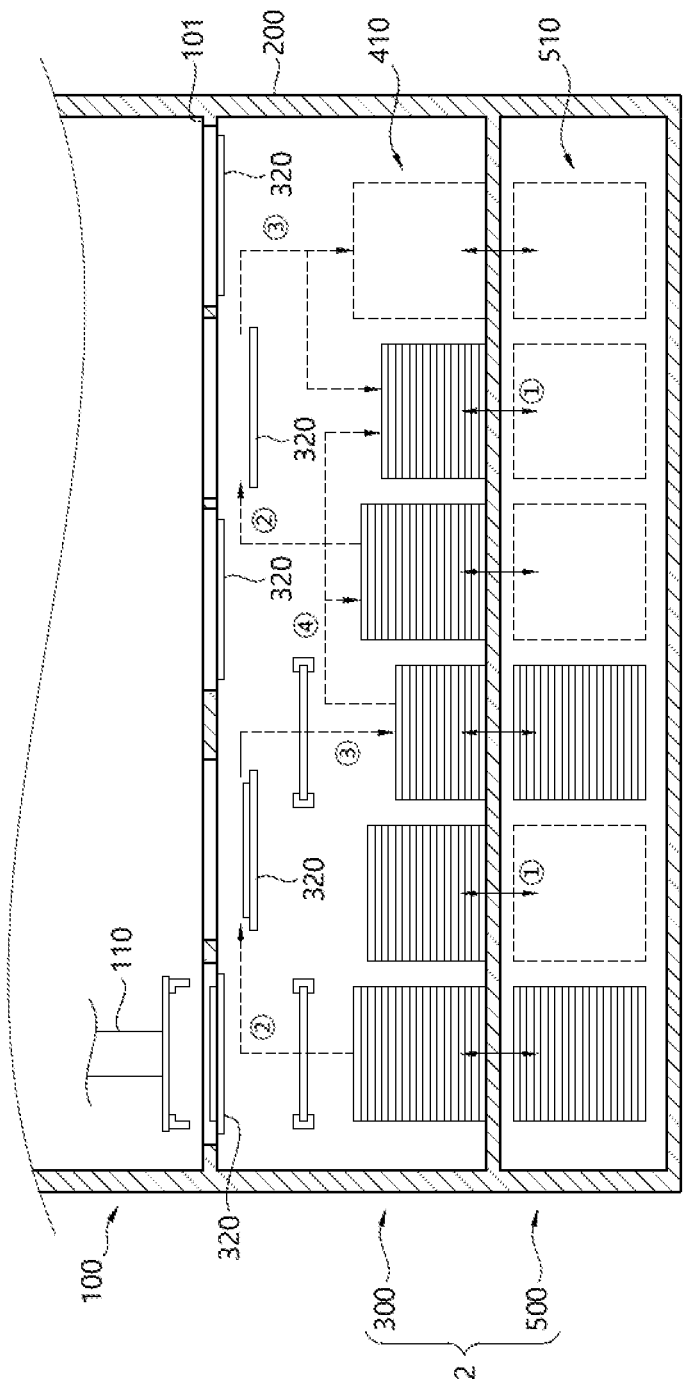
FIG. 8 is a conceptual view of the material transport inside the stacker.

FIG. 8 is a conceptual view of the material transport inside the stacker. As shown therein, the stacker 1 according to the disclosure includes the first stacking portion and the first stacking portion 410 which are arranged in a row, and may include the stacking portions in a plurality of rows. In each row, the second stacking portion 510 and the first stacking portion 410 are provided to exchange the user trays 10 with each other (①). Further, it is possible to transfer the user tray 10 from the first stacking portion 410 to the set plate 320 (②), and reversely to transfer the user tray 10 from the set plate 320 to the first stacking portion 410 (③). Further, as necessary, the user tray 10 may be transferred within the first stacking portion 410 (④). Meanwhile, the stacking portions provided in the stacker module 400 and the lower stacker 500 may be set to freely perform functions of loading, unloading and emptiness in response to a user's input. Further, the functions of the loading, unloading and emptiness are all expandable up to the lower second stacking portion 510, thereby increasing the degrees of freedom of operation and securing a high loading capacity.

Below, the scanner according to the disclosure will be described in detail with reference to FIGS. 9 to 12b.

Figure 9:
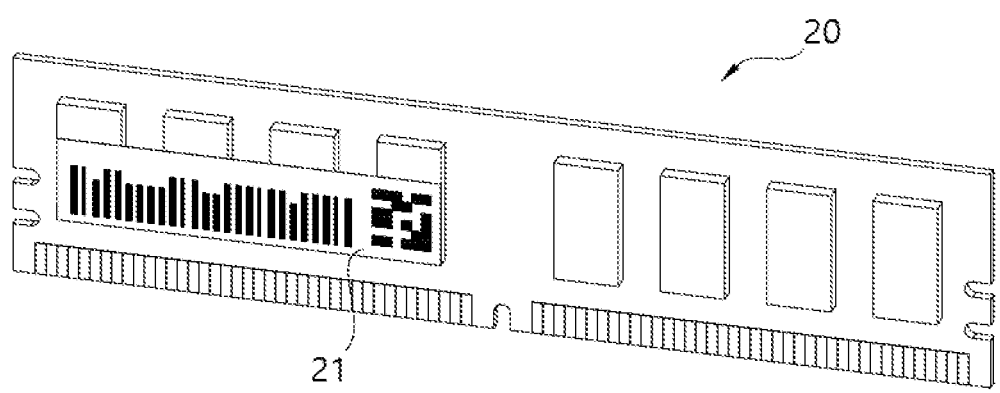
FIG. 9 is an enlarged view of the device.
Figure 10:
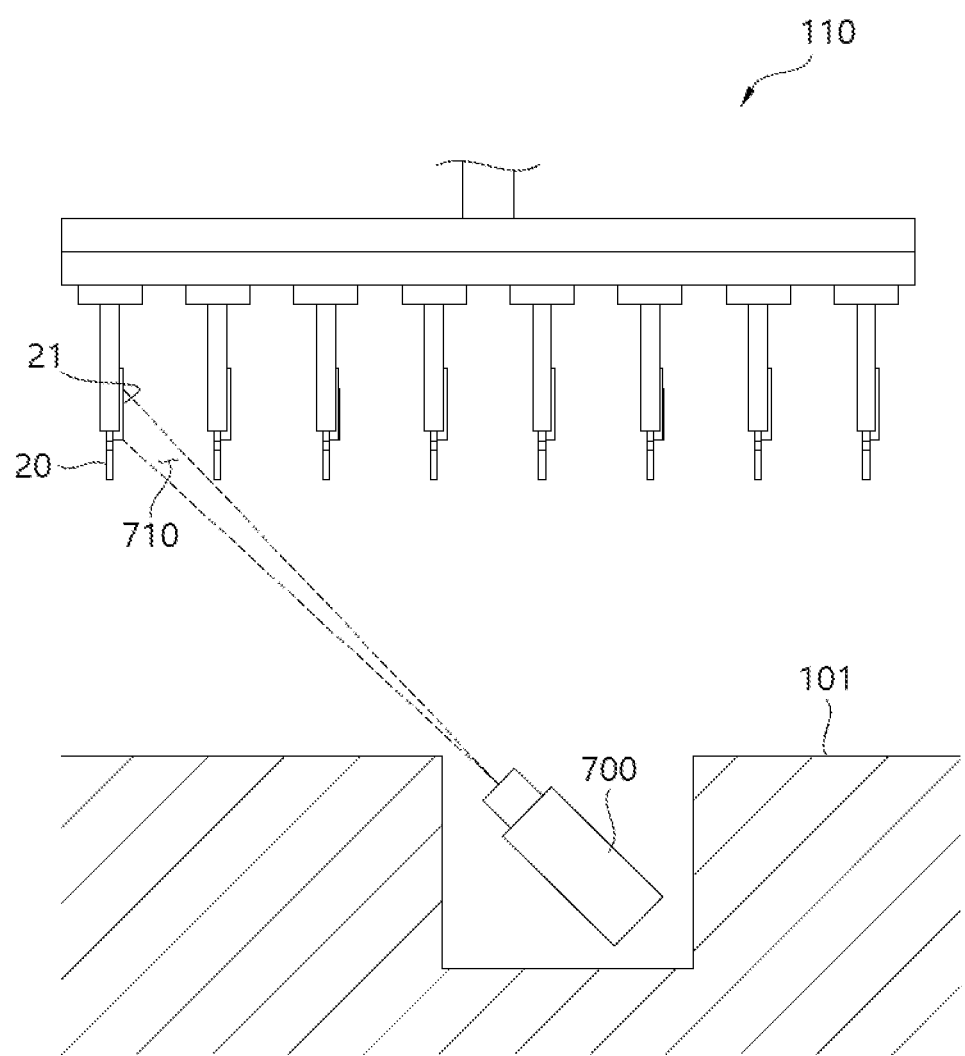
FIG. 10 is a lateral view illustrating a scanner and a hand.

FIG. 9 is an enlarged view of the device, and FIG. 10 is a lateral view illustrating a scanner and a hand.

As shown therein, a test handler according to the disclosure may include a hand provided to pick up and transfer a plurality of devices, and a scanner provided to scan the devices.

The device 20 to be scanned according to the disclosure may be a device 20 including a substrate, for example, a memory module. The device 20 subjected to the scanning may be a plate-type module having a predetermined length as shown in FIG. 9. The device 20 may include a scanning code 21 on one side thereof, in which a serial number and product information of the device 20 are recorded. The scanning code 21 may include at least one of a one-dimensional bar code and a two-dimensional quick response (QR) code.

The hand 110 may be structured to pick up the plurality of devices 20 from the user tray 10, and structured to pick up and transfer the plate-type modules which are facing each other and standing side by side. For example, eight devices 20 may be picked up and transferred in a row as they are standing side by side. When the hand 110 picks up the devices 20, the devices 20 may be spaced apart from each other as distant as a scanning view is secured so that the scanning code 21 of the device 20 can be scanned by a scanner 700 (to be described later). The hand 110 may transfer the plurality of picked-up devices 20 to be put on the test tray. Further, the transfer path of the hand 110 may be determined to pass through a scan region 710 in which the scanner 700 (to be described later) scans the bar code. Specifically, the devices 20 picked up by the hand 110 may pass through the scan region while the scanning codes 21 of the devices 20 are kept at a fixed height.

The scanner 700 is provided to scan the scanning code 21 of the device 20. The scanner 700 may be adjacent to the base 101 of the test handler main body main body. The scanner 700 may be installed at a position lower than the top of the base so as not to interfere with the movement of the hand 110 above the base. The scanner 700 may be installed to face upward so that the upper side can be the scan region 710. Further, the scanner 700 may be structured to perform scanning upward at a predetermined angle from a horizontal direction. In other words, the scanner 700 may be structured to have a scanning direction inclined at a predetermined angle from a vertical direction of the base. Specifically, if a direction in which the hand 110 goes through the scan region 710 is a frontward direction, the scanner 700 may be structured to face frontward and upward.

The scanner 700 is disposed leaving a predetermined height difference from the height at which the devices 20 are horizontally transferred, so that the scanning codes 21 can be scanned between the devices 20. The more the difference between the height at which the devices 20 are horizontally transferred and the height of the scanner 700, the more the difficulty in scanning because an angle between the scanning direction and be scanning code 21 becomes smaller even though a scan region 710 of a certain scanning code 21 is less blocked by an adjacent device 20. On the other hand, the less the difference between the height at which the devices 20 are horizontally transferred and the height of the scanner 700, the less the difficulty in scanning because an angle between the scanning direction and be scanning code 21 approximates to 90 degrees even though a scan region 710 of a certain scanning code 21 is more blocked by an adjacent device 20. Therefore, the height at which the devices 20 are horizontally transferred and the height at which the scanner 700 is placed may be determined with a proper difference therebetween, and may be varied depending on the distance between the devices 20 picked up by the hand 110.

Figure 11:
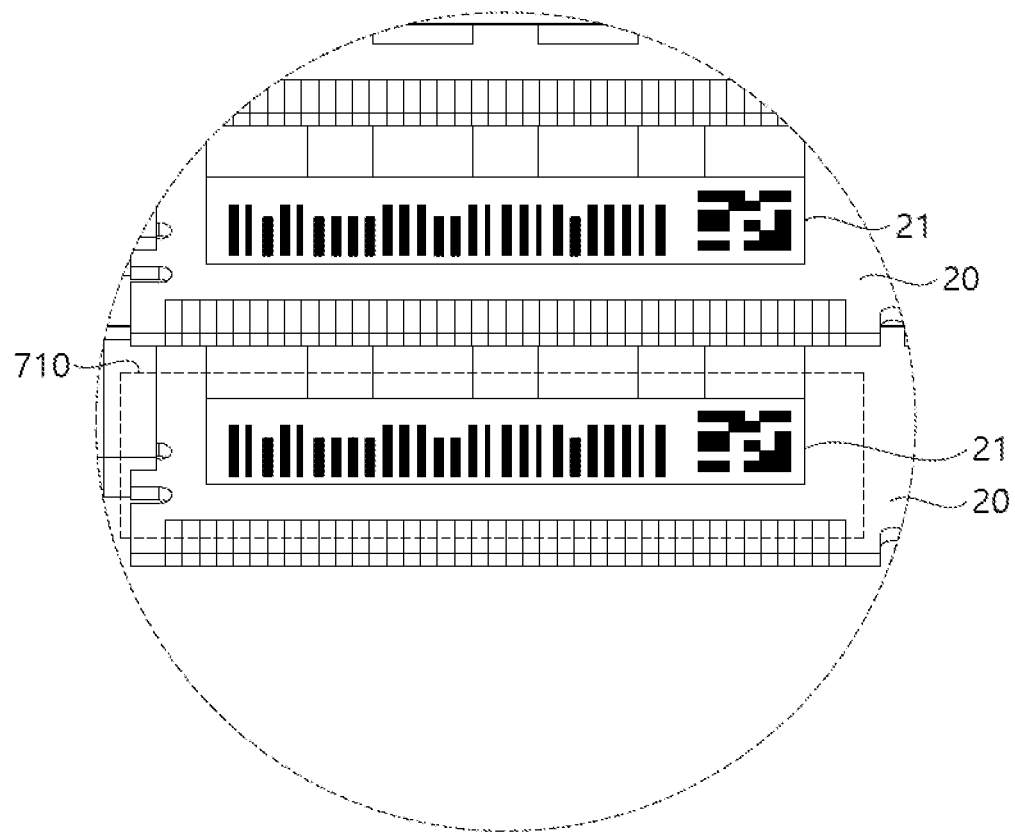
FIG. 11 shows a scan region viewed from a scanner.

FIG. 11 shows the scan region 710 viewed from the scanner 700. As shown therein, the devices 20, which are standing side by side in a row, pass through the scan region 710 in sequence. As described above, the devices 20 are arranged to have the height and form the scanning angle so that the scanning code 21 of the device 20 first entering the scan region 710 can be scanned without view interference with the following devices 20. Therefore, the scanning code 21 of the device 20 first entering the scan region 710 is scanned, and then the scanning codes 21 of the following devices 20 going through the scan region 710 are scanned in sequence. Further, an actual scanning angle between the scanning direction and the scanning code 21 becomes smaller as scanned in an upward area of FIG. 11, and it is thus difficult to perform the scanning. Accordingly, the scanning code 21 of the device 20 may be scanned in a center area of FIG. 11, in which the scanning angle approximates to 90 degrees.

Although it is not illustrated, the scanner 700 may switch over its direction to perform the scanning while facing backward and upward when the hand 110 comes to the scanner 700. In this case, the scanner 700 may be installed to face backward, and the scanning code 21 may be positioned to face frontward when the hand 110 picks up the device 20.

Figure 12A:
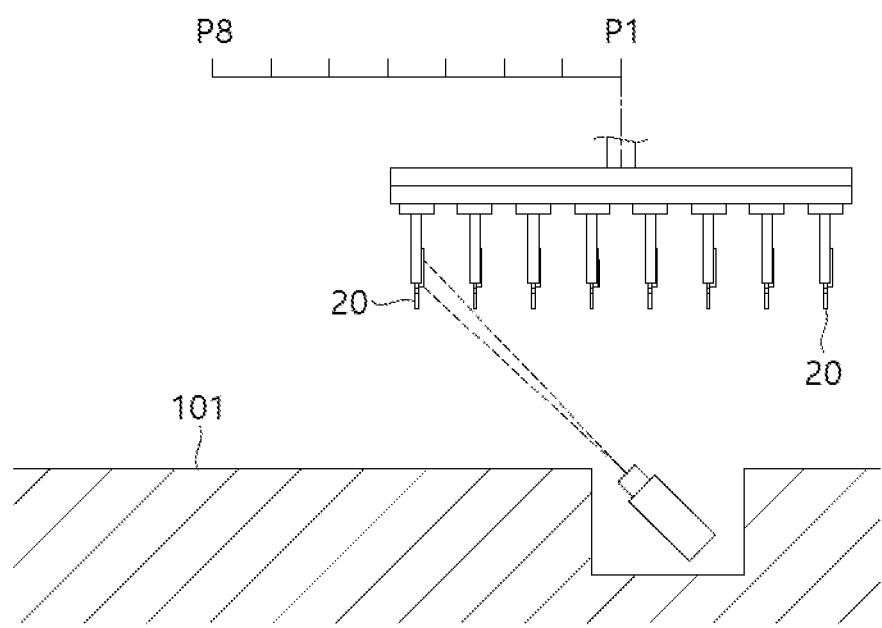
FIGS. 12A and 12b show scanning timings.
Figure 12B:
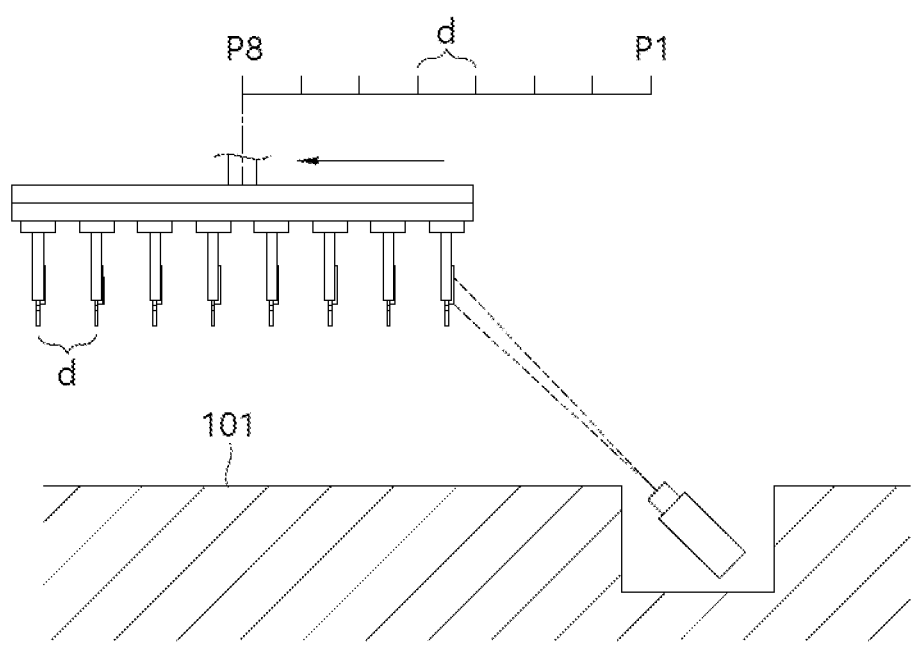

FIGS. 12A and 12b show scanning timings. As shown therein, under the condition that the scan region 710 and the scanning angle are determined, scanning timings are also determined to perform the scanning when the devices 20 are moving. In other words, the operation timing of the scanner 700 may be varied depending on the position of the hand 110.

Referring to FIG. 12A, the hand 110 simultaneously grips and transfers the devices 20, which are sequentially arrayed in a moving direction, while going through the scan region 710. When the frontmost device 10 firstly reaches the scan region 710, the scanner 700 is actuated to scan the scanning code 21. Then, the scanner 700 is actuated at the moment when the hand 110 is horizontally moved as much as the distance between the gripped devices 20 and the scanning code 21 of the following device 20 is positioned in the scan region 710.

Referring to FIG. 12B, for example, in a case where eight devices 20 are gripped at intervals of 'd', the scanner 700 is repetitively activated a total of eight times whenever the hand 110 moves as much as 'd' from a position P1 at which the frontmost device 20 gripped by the hand 110 passes through the scan region 710 up to a position P2 at which the last device is scanned.

Further, the scanning may be successively performed in the scan region 710 without stopping the hand 110, i.e., while the hand 110 is continuously moving. Further, the hand may be repetitively controlled to move as much as 'd' and then stop, and move again as much as 'd' and then stop when the scanning is completed. The number of times to move and stop the hand may be varied depending on the number of picked-up devices, and the hand 110 may pass through the scan region 710 while having at least one stop.

With this structure, the scanning may be performed during the transfer without transferring the scanning codes 21 of the devices 20 to other scan region 710 or additionally changing the position of the device 20 for the scanning. Specifically, that may be provided on a transfer path from the user tray 10 to the test tray 130 or the loading shuttle 120, so that the scanning can be performed during the transfer. To this end, the path of the hand 110 may be determined independently of the operations of the scanner 700, and may be selected to be positioned for scanning the scanner 700 on the path of the hand 110.

As described above, the test handler according to the disclosure performs the scanning interlocking with the position of the hand 110 without stopping the hand to scan the devices, and does not require any separate operation of the hand 110 for the scanning because the scanning is performed during the transfer, thereby having effects on improving the efficiency of the operation.

The invention claimed is:

1. An electronic device test handler comprising:
   a hand provided to pick up, transfer, and place a plurality of devices; and
   a scanner provided to scan a region at a predetermined angle on a transfer path of the plurality of devices,
   wherein the transfer path is between a position where the hand picks up the plurality of devices and a position where the hand places the plurality of devices, and
   wherein the scanner sequentially scans the plurality of devices one by one as the plurality of devices are passed by the hand through the scan region.

2. The electronic device test handler of claim 1, wherein the hand is provided to pick up the plurality of devices to be spaced apart from each other side by side, and
   the scanner is provided to scan a space between the plurality of devices at a predetermined angle.

3. The electronic device test handler of claim 1, wherein each of the plurality of devices comprises a plate-type substrate, the substrate comprising at least one scanning code on one side thereof, and
   the hand picks up the plurality of devices with the scanning codes arranged in one direction.

4. The electronic device test handler of claim 3, wherein the scanner is provided to scan the scanning code whenever the device passes through the scan region on the transfer path of the devices.

5. The electronic device test handler of claim 4, wherein the hand is controlled to pass through the scan region while moving.

6. The electronic device test handler of claim 4, wherein the hand is controlled to stop at least once while moving in the scan region so that the plurality of devices are sequentially positioned in the scan region.

7. The electronic device test handler of claim 4, wherein a distance between a plurality of substrates comprises a distance at which the scanning code does not interfere with an adjacent substrate when the scanner performs the scanning at an inclined angle.

8. The electronic device test handler of claim 4, wherein
the hand is provided to move above the scanner, and
the scanner is provided to perform the scanning while facing upward at a predetermined angle from a horizontal direction.

9. The electronic device test handler of claim 8, wherein the scanner is provided to perform the scanning while facing frontward and upward in back of the hand when the hand with the plurality of devices passes through the scan region.

10. The electronic device test handler of claim 8, wherein the scanner is provided to perform the scanning while facing backward and upward in front of the hand when the hand with the devices passes through the scan region.

11. The electronic device test handler of claim 4, wherein the scanner is provided to recognize the scanning code comprising at least one of a one-dimensional code and a two-dimensional code.

12. The electronic device test handler of claim 4, further comprising a controller configured to control operations of the hand and the scanner,
wherein the controller controls the scanner to perform the scanning whenever each of the plurality of devices passes through the scan region.

\* \* \* \* \*